(12) United States Patent
Nakayama et al.

(10) Patent No.: US 10,244,657 B2
(45) Date of Patent: Mar. 26, 2019

(54) THERMAL INSULATION SHEET AND METHOD FOR PRODUCING SAME

(71) Applicant: Panasonic Intellectual Property Management Co., Ltd., Osaka (JP)

(72) Inventors: Masafumi Nakayama, Hokkaido (JP); Yoshiya Sakaguchi, Kyoto (JP); Hirofumi Yamada, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 134 days.

(21) Appl. No.: 15/023,418

(22) PCT Filed: Sep. 1, 2014

(86) PCT No.: PCT/JP2014/004458
§ 371 (c)(1),
(2) Date: Mar. 21, 2016

(87) PCT Pub. No.: WO2015/059855
PCT Pub. Date: Apr. 30, 2015

(65) Prior Publication Data
US 2016/0219752 A1    Jul. 28, 2016

(30) Foreign Application Priority Data

Oct. 21, 2013 (JP) .................................. 2013-218088
Feb. 14, 2014 (JP) .................................. 2014-026144

(51) Int. Cl.
*H05K 7/20* (2006.01)
*H05K 5/02* (2006.01)
*H01L 23/427* (2006.01)

(52) U.S. Cl.
CPC ....... *H05K 7/2039* (2013.01); *H01L 23/4275* (2013.01); *H05K 5/0213* (2013.01); *H01L 2924/0002* (2013.01)

(58) Field of Classification Search
None
See application file for complete search history.

(56) References Cited

U.S. PATENT DOCUMENTS

2008/0318048 A1\* 12/2008 Amrhein .................. B01J 13/02
428/402.21
2013/0065011 A1    3/2013 Suzuki et al.

FOREIGN PATENT DOCUMENTS

JP    2000-148306    5/2000
JP    2001-248987    9/2001
(Continued)

OTHER PUBLICATIONS

International Search Report of PCT application No. PCT/JP2014/004458 dated Dec. 2, 2014.

*Primary Examiner* — Jeffrey D Washville
(74) *Attorney, Agent, or Firm* — McDermott Will & Emery LLP

(57) ABSTRACT

A thermal insulation sheet includes a heat storage sheet, an insulation sheet affixed to the heat storage sheet, and a highly-thermoconductive sheet affixed to the insulation sheet. The heat storage sheet contains a resin and powdery microcapsules mixed with the resin. The powdery microcapsules encapsulate latent-heat storage agent. The heat storage sheet has a void ratio not less than 10% and not more than 30%. Or, the heat storage sheet may have surface roughness Ra not less than 2 μm and not more than 20 μm. The thermal insulation sheet suppresses or retards transfer- (Continued)

ring of heat generated in a heat-generating component to outside, and suppresses a rapid rising of a temperature of the heat-generating component.

14 Claims, 12 Drawing Sheets

(56) References Cited

FOREIGN PATENT DOCUMENTS

| | | |
|---|---|---|
| JP | 2001-308242 | 11/2001 |
| JP | 2008-516413 | 5/2008 |
| JP | 2008-291083 | 12/2008 |
| JP | 2009-123769 | 6/2009 |
| JP | 2010-251463 | 11/2010 |
| JP | 2012-087182 | 5/2012 |
| JP | 2012-151196 | 8/2012 |
| WO | 2005/048298 | 5/2005 |
| WO | 2011/111716 | 9/2011 |

* cited by examiner

THERMAL INSULATION SHEET AND METHOD FOR PRODUCING SAME

This application is a U.S. national stage application of the PCT international application No. PCT/JP2014/004458 filed on Sep. 1, 2014, which claims the benefit of foreign priority of Japanese patent applications No. 2013-218088 filed on Oct. 21, 2013 and No. 2014-026144 filed on Feb. 14, 2014, the contents all of which are incorporated herein by reference.

TECHNICAL FIELD

The present invention relates to a thermal insulation sheet capable of suppressing or retarding transferring of heat generated in a heat-generating component to outside, and to a method for manufacturing the thermal insulation sheet.

BACKGROUND ART

As various electronic devices have increasingly had high performance in recent years, heat-generating components, such as integrated circuits (ICs), generate a large amount of heat heating a chassis of an electronic device. Further, an excessively heated IC may degrade an operating speed of the IC. FIG. 9 is a cross-sectional view of conventional electronic device 500. In electronic device 500, heat diffusion sheet 2A, such as a graphite sheet, with a high thermoconductivity is thermally connected to heat-generating component 2 mounted on substrate 1 to dissipate heat generated by the component.

PTL 1 discloses a device similar to electronic device 500.

Conventional electronic device 500 shown in FIG. 9 can address heat generation to some extent; but often has difficulty in heat dissipation for instantaneous increase of heat generation. In particular, electronic device 500 generates heat when downloading a lot of data. Such downloading does not continue for a long time. Therefore, it is important to suppress the temporary raising of a temperature due to the heat generation. Besides, the longer the time of heat generation, the higher the temperature of heat-generating component 2. It also needs to suppress the temperature. The rising of temperature increases interconnection resistance, power consumption of the device, and the usage of the battery for driving electronic device 500. Suppressing temperature rise is therefore critical.

CITATION LIST

Patent Literature

PTL 1: Japanese Patent Laid-Open Publication No. 2008-516413

SUMMARY

A thermal insulation sheet includes a heat storage sheet, an insulation sheet affixed to the heat storage sheet, and a highly-thermoconductive sheet affixed to the insulation sheet. The heat storage sheet contains a resin and powdery microcapsules mixed with the resin. The powdery microcapsules encapsulate latent-heat storage agent. The heat storage sheet has a void ratio not less than 10% and not more than 30%. Or, the heat storage sheet may have surface roughness Ra not less than 2 μm and not more than 20 μm.

The thermal insulation sheet suppresses or retards transferring of heat generated in a heat-generating component to outside, and suppresses a rapid rising of a temperature of the heat-generating component.

DETAIL DESCRIPTION OF PREFERRED EMBODIMENTS

Exemplary Embodiment 1

Figure 1A:
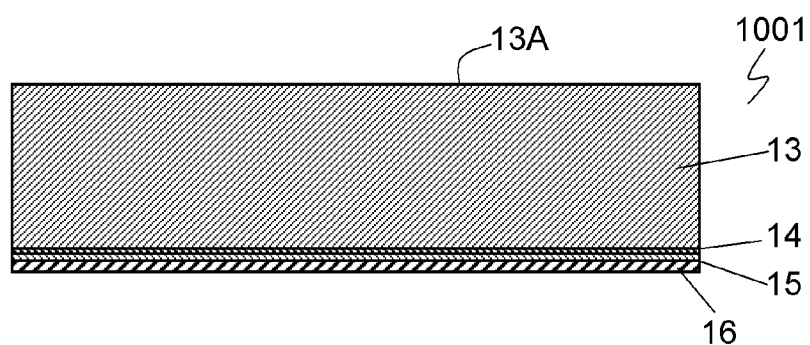
FIG. 1A is a cross-sectional view of a thermal insulation sheet in accordance with Exemplary Embodiment 1.
Figure 1B:
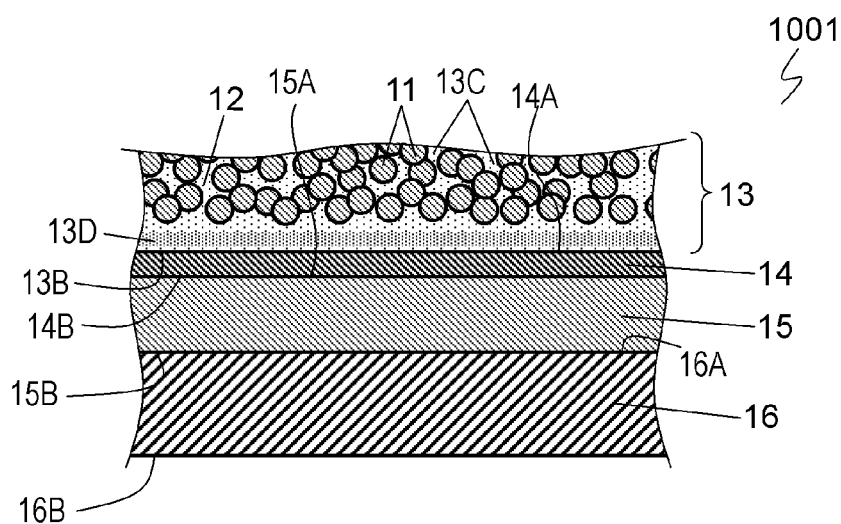
FIG. 1B is an enlarged cross-sectional view of the thermal insulation sheet shown in FIG. 1A.

FIG. 1A is a cross-sectional view of thermal insulation sheet 1001 of Exemplary Embodiment 1. FIG. 1B is an enlarged cross-sectional view of thermal insulation sheet 1001 shown in FIG. 1A. Insulation sheet 14 has surface 14A and surface 14B opposite to surface 14A. Thermal insulation sheet 1001 includes insulation sheet 14, heat storage sheet 13 affixed to surface 14A of insulation sheet 14, and highly-thermoconductive sheet 15 affixed to surface 14B of insulation sheet 14. Highly-thermoconductive sheet 15 has surface 15A and surface 15B opposite to surface 15A. Surface 15A of highly-thermoconductive sheet 15 is affixed to surface 14B of insulation sheet 14 Thermal insulation sheet 1001 may further include insulation sheet 16 affixed to surface 15B of highly-thermoconductive sheet 15.

Figure 1C:
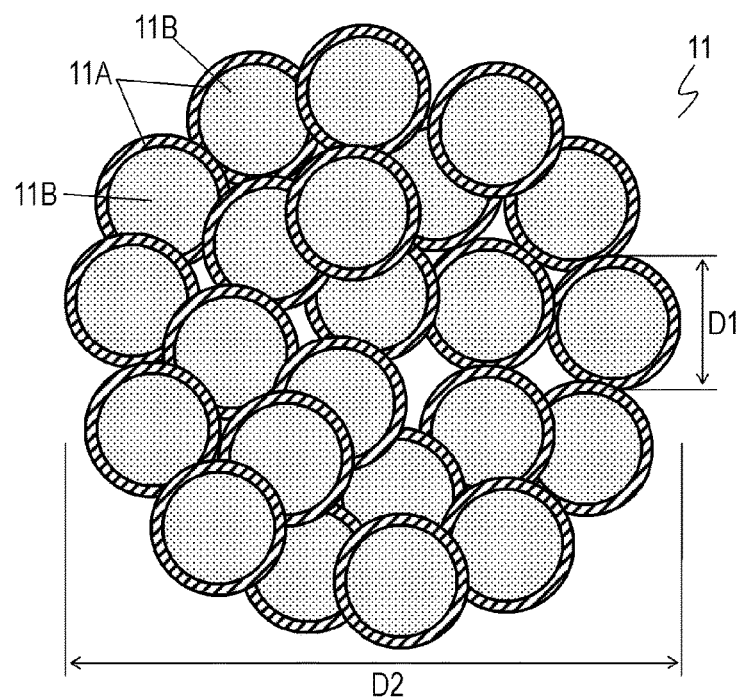
FIG. 1C is a cross-sectional view of a powdery microcapsule of the thermal insulation sheet in accordance with Embodiment 1.

Heat storage sheet 13 contains resin 12 and powdery microcapsules 11 mixed with resin 12. Powdery microcapsules 11 encapsulate latent-heat storage agent. FIG. 1C is a cross-sectional view of powdery microcapsules 11. Powdery microcapsule 11 includes spherical capsules 11A and latent-heat storage agent 11B encapsulated in each of capsules 11A. Capsules 11A according to Embodiment 1 are made of formalin resin. Latent-heat storage agent 11B according to Embodiment 1 is paraffin with a melting point of about 39° C. Capsule 11A has a spherical body having diameter D1 ranging from 1 μm to 3 μm. Powdery microcapsule 11 is a secondary particle having diameter D2 of about 50 μm including plural capsules 11A which agglomerate. Heat storage sheet 13 with a thickness of about 0.6 mm is structured by mixing powdery microcapsules 11 into resin 12 and forming the mixture into a sheet. Resin 12 may be made of urethane resin. Urethane resin allows even a large amount of powdery microcapsules 11 to be mixed with the resin with no crush. Further, resin 12 made of urethane resin provides heat storage sheet 13 with flexibility.

Heat storage sheet 13 contains about 70% by weight of powdery microcapsule 11. Increasing of the mixing ratio of powdery microcapsule 11 in heat storage sheet 13 increases a thermoconductivity of heat storage sheet 13. However, a mixing ratio larger than 90% by weight has difficulty not only in kneading but also in retaining strength and a shape as a sheet. If the mixing ratio of powdery microcapsule 11 is smaller than 40% by weight, powdery microcapsules 11 as secondary particles are separated from each other and suspended in resin 12. This situation reduces heat storable in heat storage sheet 13 and prevents heat storage sheet 13 from exhibiting its adequate performance. According to Embodiment 1, the mixing ratio not less than 40% allows powdery microcapsules 11 to contact one another and transfer heat quickly to all over heat storage sheet 13. Considering above, the mixing ratio of powdery microcapsules 11 in heat storage sheet 13 preferably ranges from 40% and 90% by weight; more preferably, from 50% and 90% by weight.

A lot of voids 13C are formed in a surface and an inside of heat storage sheet 13. The void ratio which is the ratio of the total volume of voids 13C to the entire volume of heat storage sheet 13 is about 15%. This ratio allows a microscopic surface area of heat storage sheet 13 to be about ten times a macroscopic geometrical surface area of heat storage sheet 13. As a result, heat storage sheet 13 radiates a large amount of heat from its surface and suppresses rising of a temperature of thermal insulation sheet 1001. According to Embodiment 1, the void ratio is obtained by the following way. While heat storage sheet 13 is immersed into water, voids 13C are filled with the water by vacuuming heat storage sheet 13. The void ratio is obtained by calculating the volume of the water filling voids 13C to the entire volume of heat storage sheet 13. The higher the void ratio of heat storage sheet 13 is, the larger the surface area of heat storage sheet 13, i.e., the higher the heat radiation efficiency is. However, an excessive increase in void ratio decreases the amount of powdery microcapsules 11 in heat storage sheet 13, degrading heat storage performance of heat storage sheet 13. The void ratio of heat storage sheet 13 is preferably not less than 10% and not more than 30%. The range of the void ratio allows heat storage sheet 13 to exhibit heat radiation ratio of not less than 80% on its surface at 60° C. Just after storing heat generated in a heat-generating component connected thermally to heat storage sheet 13, heat storage sheet 13 radiates the heat. Therefore, even when a heat-generating component keeps working, the rising of temperature of the heat-generating component is suppressed.

Surface 14A of insulation sheet 14 is affixed to surface 13B of heat storage sheet 13. Insulation sheet 14 according to Embodiment 1 is made of polyethylene terephthalate (PET) with a thickness of about 10 μm. Surface 15A of highly-thermoconductive sheet 15 is affixed to surface 14B of insulation sheet 14 via an adhesive of acrylic resin. Highly-thermoconductive sheet 15 is made of, for example, a pyrolytic graphite sheet with a thickness of about 25 μm. Other than the pyrolytic graphite sheet, materials, such as a copper film and an aluminum film, having a thermoconductivity not less than 100 W/m° K can be employed for highly-thermoconductive sheet 15. A graphite sheet has a higher thermoconductivity in a surface direction of the graphite sheet considerably, about 1600 W/m° K in the surface direction parallel to surfaces 15A and 15B, than the aforementioned metallic films, and has high flexibility. From the reason above, a graphite sheet may be preferably employed for highly-thermoconductive sheet 15.

Insulation sheet 16 is preferably affixed to surface 15B of highly-thermoconductive sheet 15. This sheet protects highly-thermoconductive sheet 15 while handling. Insulation sheet 16 may be a double-sided adhesive tape. The double-sided adhesive tape allows highly-thermoconductive sheet 15 to tightly contact a heated area, enhancing the performance of highly-thermoconductive sheet 15.

"Affixing" heat storage sheet 13 to insulation sheet 14 means that heat storage sheet 13 is "affixed" to insulation sheet 14 as a result. That is, after heat storage sheet 13 is formed, insulation sheet 14 may be affixed to heat storage sheet 13, or heat storage sheet 13 may be formed on surface 14A of insulation sheet 14.

Heat storage sheet 13 has surface 13A opposite to surface 13B. Surface 13A of heat storage sheet 13 preferably has nothing thereon and are thoroughly exposed to the outside. This structure enhances efficiency of heat radiation from surface 13B of heat storage sheet 13.

Figure 2:
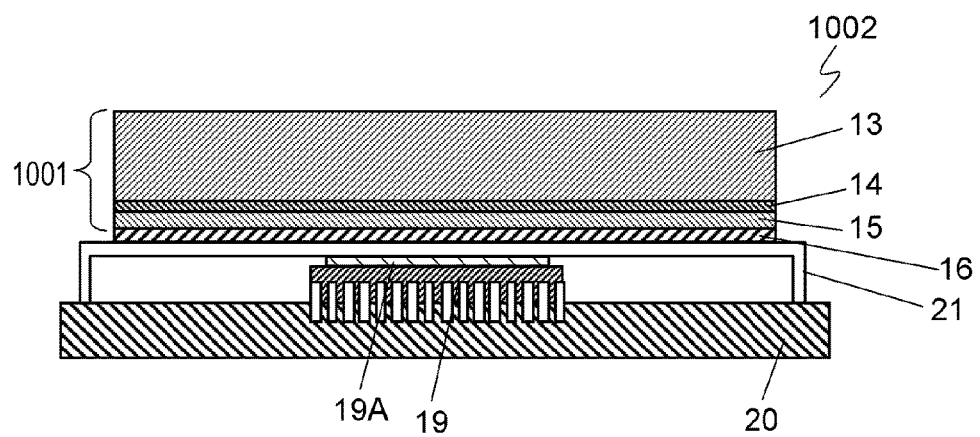
FIG. 2 is a cross-sectional view of an electronic device in accordance with Embodiment 1.

FIG. 2 is a cross-sectional view of device 1002 having thermal insulation sheet 1001. Device 1002 includes substrate 20, heat-generating component 19, such as an integrated circuit (IC) mounted onto substrate 20, shield case 21 thermally connected to heat-generating component 19 via thermal interface material 19A, and thermal insulation sheet 1001.

Surface 15B of highly-thermoconductive sheet 15 of thermal insulation sheet 1001 is affixed to shield case 21 via insulation sheet 16 of double-faced adhesive tape. This structure allows heat generated in heat-generating component 19 to transmit to highly-thermoconductive sheet 15 via shield case 21 and to be diffused in the surface direction of highly-thermoconductive sheet 15. The entire of highly-thermoconductive sheet 15 may be completely affixed to heat storage sheet 13, thereby allowing heat to smoothly transmit to the entire area of heat storage sheet 13. When the temperature of latent-heat storage agent 11B reaches a predetermined temperature, the heat transmitting to heat storage sheet 13 is used for melting latent-heat storage agent 11B, and retards heat storage sheet 13 from temperature rise. The structure particularly advantageously addresses sudden heat generation of heat-generating component 19. Further, heat storage sheet 13 has voids 13C therein, i.e., the sheet has a large surface area. Infrared radiation of heat storage sheet 13 with the large surface area effectively diffuses heat, thereby reducing the temperature of heat-generating component 19.

Figure 3:
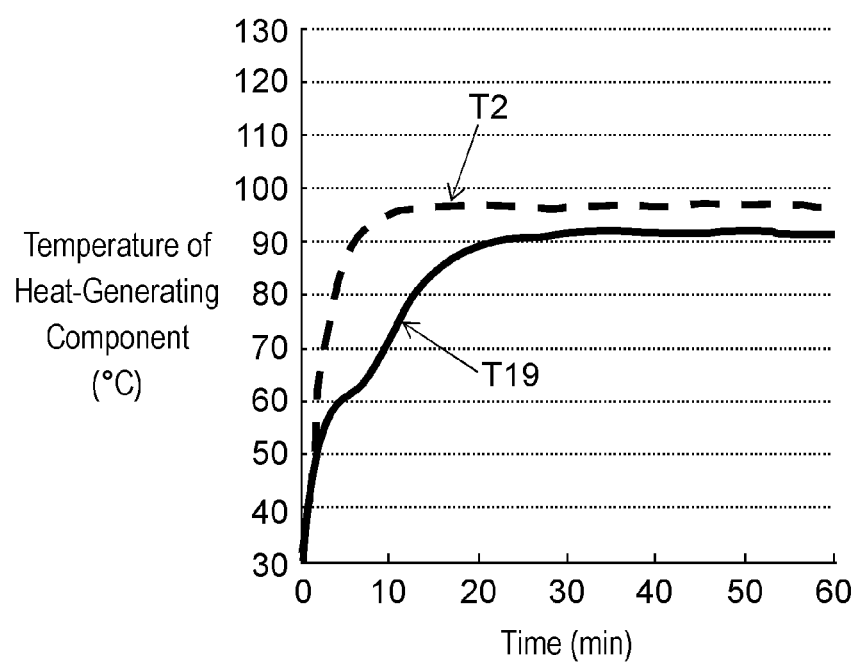
FIG. 3 shows an evaluation result of the thermal insulation sheet in accordance with Embodiment 1.
Figure 9:
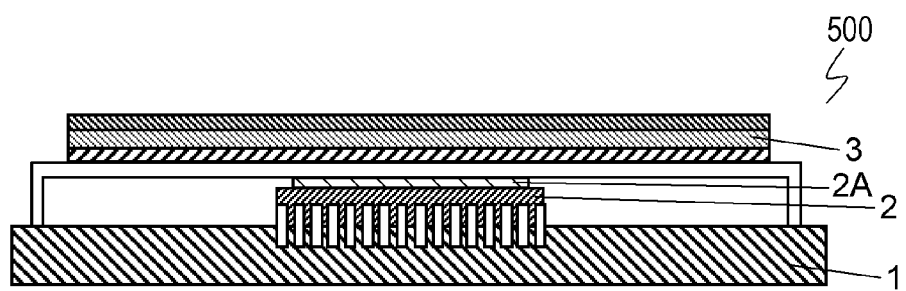
FIG. 9 is a cross-sectional view of a conventional electronic device.

FIG. 3 shows temperature T19 of heat-generating component 19 mounted to device 1002 using thermal insulation sheet 1001 according to Embodiment 1. FIG. 3 also shows temperature T2 of heat-generating component 2 mounted to conventional electronic device 500 shown in FIG. 9. Device 1002 according to Embodiment 1 exhibits a smaller gradient of a temperature rise in an early stage of heat generation, and provides a lower reaching temperature of the heat-generating component in prolonged heat generation than conventional electronic device 500.

According to Embodiment 1, latent-heat storage agent 11B encapsulated in all of capsules 11A has substantially the same melting point of about 39° C. Heat storage sheet 13 does not necessarily include a single type of powdery microcapsules 11. In heat storage sheet 13, resin 12 may be mixed with powdery microcapsules 11 with latent-heat storage agent 11B having a melting point of about 39° C. and with powdery microcapsules 11 with latent-heat storage agent 11B having a melting point of about 60° C.). Such structured heat storage sheet 13 further suppresses a rapid rising of a temperature of heat-generating component 19.

A method for manufacturing thermal insulation sheet 1001 will be described below. FIGS. 4A to 4D are schematic views illustrating the method for manufacturing thermal insulation sheet 1001.

First, a moisture content, i.e., an amount of moisture contained in powdery microcapsule 11 is measured. If powdery microcapsules 11 have a moisture content smaller than 0.4% or more than 2%, powdery microcapsules 11 are put into a humidifier or a drier. That is, the moisture content is controlled to be not less than 0.4% and not more than 2%. Powdery microcapsules 11 with the moisture content thus controlled are mixed with resin 12 to provide heat-storage paste 17.

Resin 12 according to the embodiment is made of urethane resin. The urethane resin contains a base compound and a curative agent. The urethane resin which is hardened has a penetration depth ranging from 50 to 250, more preferably from 80 to 180 by resin hardening evaluation of JIS K2207. Ordinary urethane resin has a penetration depth not more than about 20. If a large amount of powdery microcapsules is mixed with such an ordinary urethane resin and the resultant mixture is hardened, the hardened mixture resultant is brittle, accordingly failing to retain a sheet shape. In contrast, a urethane resin with an excessively large penetration depth does not have a large strength, accordingly failing to retain a sheet shape. According to Embodiment 1, the hardened urethane resin with a penetration depth ranging from 50 to 250 can have a sheet shape even when a mixing ratio not less than 40% by weight of powdery microcapsules 11 is mixed with the resin.

According to Embodiment 1, heat-storage paste 17 contains about 70% by weight of powdery microcapsules 11 and about 30% by weight of resin 12.

Figure 4A:
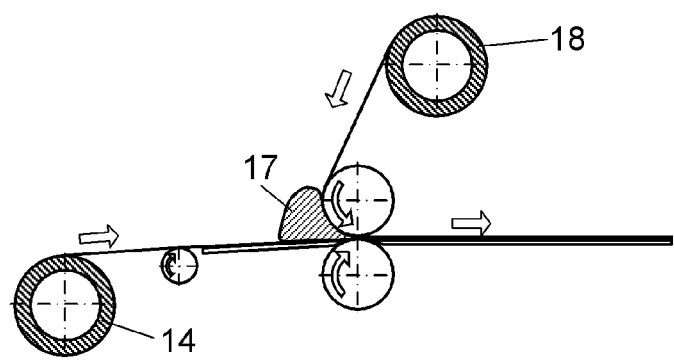
FIG. 4A illustrates a method for manufacturing the thermal insulation sheet in accordance with Embodiment 1.
Figure 4B:
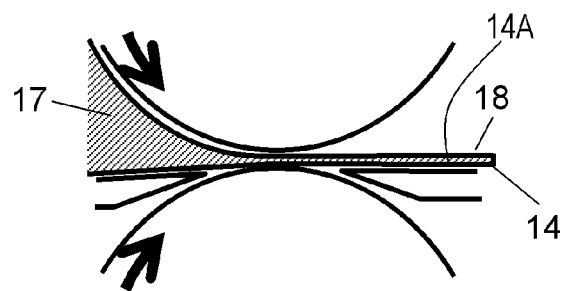
FIG. 4B illustrates the method for manufacturing the thermal insulation sheet in accordance with Embodiment 1.

As shown in FIGS. 4A and 4B, heat-storage paste 17 is shaped by a roller shaping machine while being sandwiched between insulation sheet 14 and shaper sheet 18, thereby having a sheet shape with a thickness of about 0.6 mm Insulation sheet 14 is a PET film with a thickness of about 10 μm. A corona treatment is performed to surface 13A of heat storage sheet 13 to form a polar group, such as a hydroxyl group or a carboxyl group, on surface 13A, thereby polarizing surface 13A and forming irregularities in surface 13A. This structure provides surface 14A of insulation sheet 14 with so high wettability to resin 12, that resin 12 may spread on surface 14A of insulation sheet 14 when heat storage sheet 13 is formed. That is, layer 13D (see FIG. 1B) with no powdery microcapsule 11 is formed at surface 13B of heat storage sheet 13 contacting insulation sheet 14. Layer 13D has a thickness ranging from about 5 to 10 μm. Hardening resin 12 securely sticks heat storage sheet 13 onto insulation sheet 14, accordingly increasing a thermoconductivity between sheets 13 and 14.

Like insulation sheet 14, shaper sheet 18 may be an insulation sheet made of, e.g. a PET film with a thickness of about 10 μm. Such structured shaper sheet 18 can function as a protective film. Further, shaper sheet 18 may be a releasable film. In this case, shaper sheet 18 is removed from thermal insulation sheet 1001 after thermal insulation sheet 1001 is mounted, shaper sheet 18 prevents heat storage sheet 13 from being exposed.

Next, insulation sheet 14 with heat storage sheet 13 formed thereon is dried at 90° C. for about 20 hours in a dryer to harden heat storage sheet 13. In the hardening process, moisture attached to powdery microcapsules 11 tend to escape outside heat storage sheet 13, thereby forming voids 13C in heat storage sheet 13. At this moment, powdery microcapsules 11 with an excessively small moisture content fails to form a sufficient amount of voids 13C. In contrast, powdery microcapsules 11 with an excessively large moisture content fails to escape evaporated moisture, and produces an excessive number of bubbles between shaper sheet 18 and heat storage sheet 13, resulting in disfigurement or in poor hardening of resin 12. Considering above, the moisture content of powdery microcapsules 11 is preferably controlled to be not less than 0.4% and not more than 2%; more preferably, not less than 0.4% and not more than 1%.

Figure 4C:
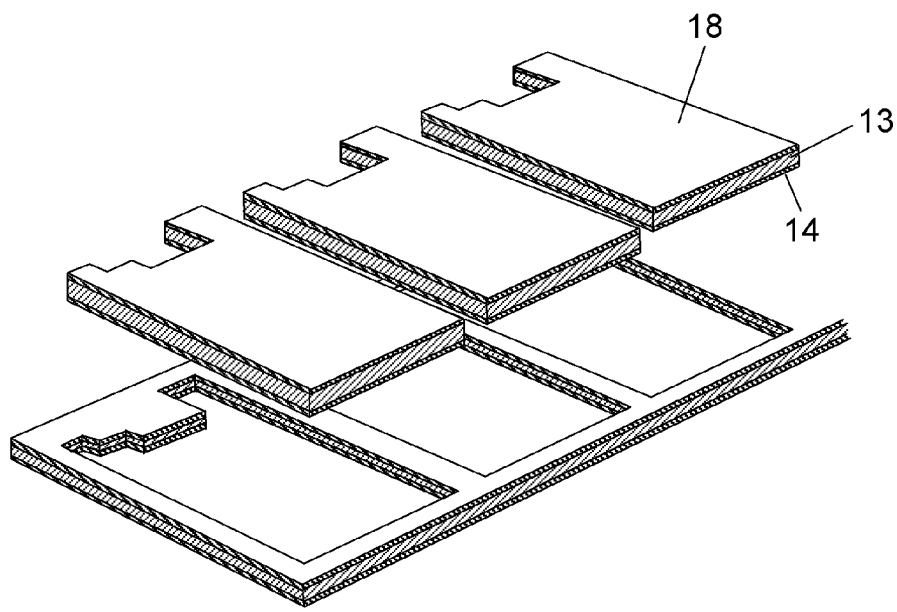
FIG. 4C illustrates the method for manufacturing the thermal insulation sheet in accordance with Embodiment 1.

Next, as shown in FIG. 4C, insulation sheet 14 with hardened heat storage sheet 13 formed thereon is cut into a predetermined shape with a mold tool.

Figure 4D:
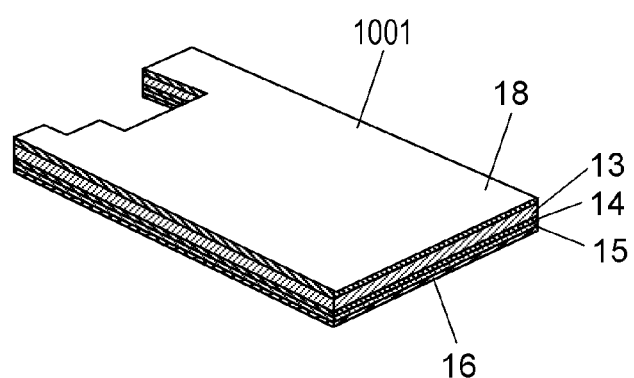
FIG. 4D illustrates the method for manufacturing the thermal insulation sheet in accordance with Embodiment 1.

Next, highly-thermoconductive sheet 15 is affixed onto surface 14B of insulation sheet 14, providing thermal insulation sheet 1001 shown in FIG. 4D. Highly-thermoconductive sheet 15 is a pyrolitic graphite sheet with a thickness of about 25 μm. Highly-thermoconductive sheet 15 is affixed to surface 14B of insulation sheet 14 with a double-sided adhesive tape adhering onto surface 15A of it.

Insulation sheet 16 is preferably affixed to surface 15B of highly-thermoconductive sheet 15. In this case, highly-thermoconductive sheet 15 with insulation sheet 16 previously affixed to surface 15B is preferably affixed to surface 14B of insulation sheet 14. This process protects highly-thermoconductive sheet 15 during handling. Insulation sheet 16 may be made of a double-sided adhesive tape. This material allows heat-generating component 19 to securely contact highly-thermoconductive sheet 15, enhancing the performance of highly-thermoconductive sheet 15.

Exemplary Embodiment 2

Figure 5A:
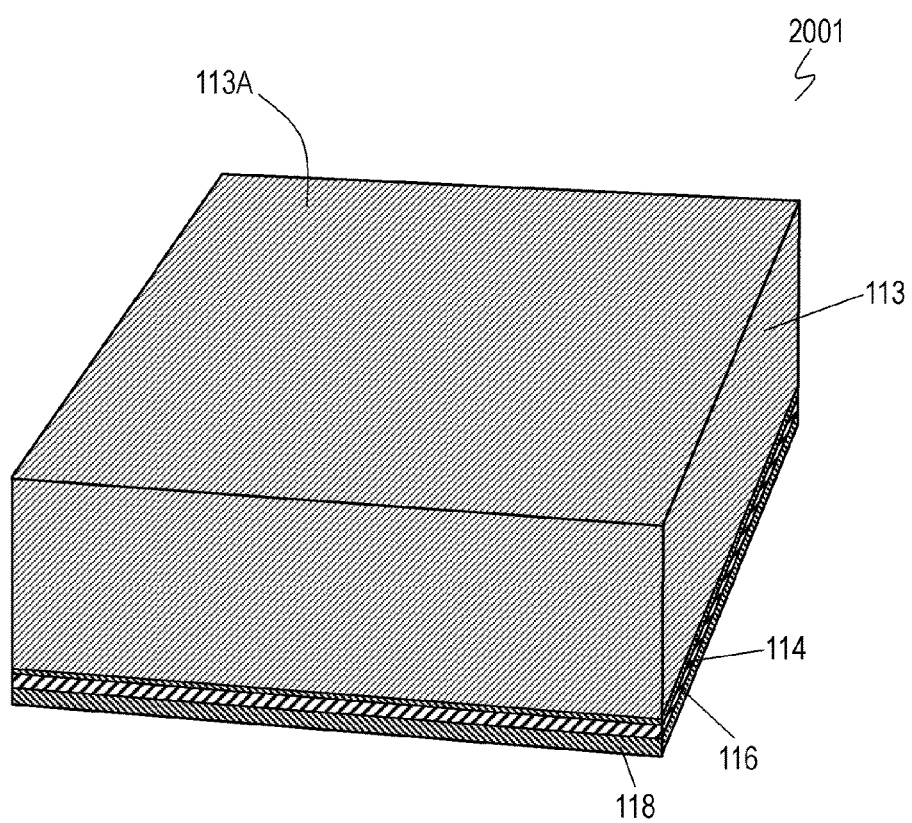
FIG. 5A is a perspective view of a thermal insulation sheet in accordance with Exemplary Embodiment 2.
Figure 5B:
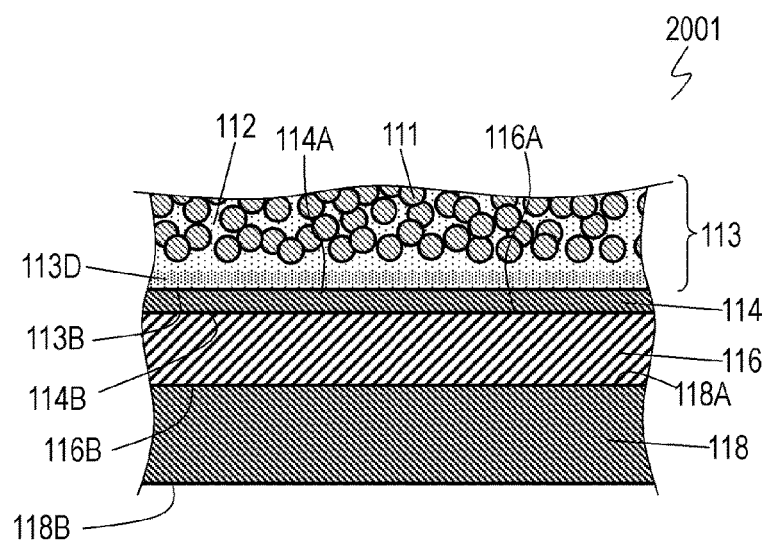
FIG. 5B is an enlarged cross-sectional view of the thermal insulation sheet in accordance with Embodiment 2.
Figure 5C:
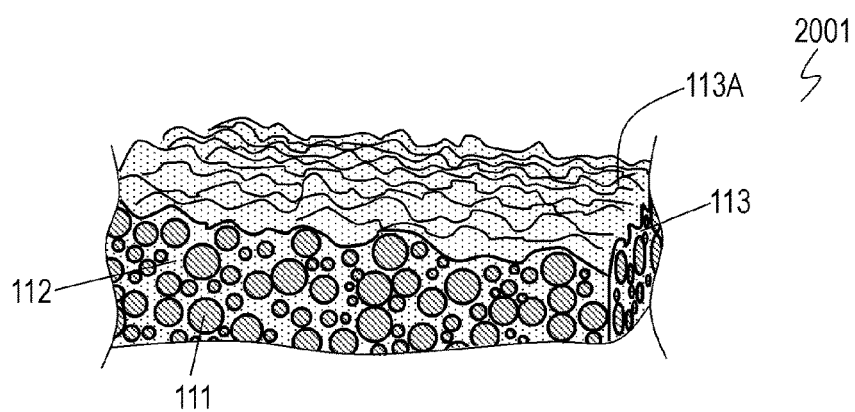
FIG. 5C is an enlarged perspective view of the thermal insulation sheet in accordance with Embodiment 2.

FIG. 5A is a perspective view of thermal insulation sheet 2001 in accordance with Exemplary Embodiment 2. FIG. 5B is an enlarged cross-sectional view of thermal insulation sheet 2001. FIG. 5C is an enlarged perspective view of thermal insulation sheet 2001. Insulation sheet 114 has surface 114A and surface 114B opposite to surface 114A. Thermal insulation sheet 2001 includes insulation sheet 114, heat storage sheet 113 affixed to surface 114A of insulation sheet 114, and highly-thermoconductive sheet 116 affixed to surface 114B of insulation sheet 114. Highly-thermoconductive sheet 116 has surface 116A and surface 116B opposite to surface 116A. Surface 116A of highly-thermoconductive sheet 116 is affixed to surface 114B of insulation sheet 114.

Thermal insulation sheet 1001 may further include insulation sheet 118 affixed to surface 116B of highly-thermoconductive sheet 116.

Figure 5D:
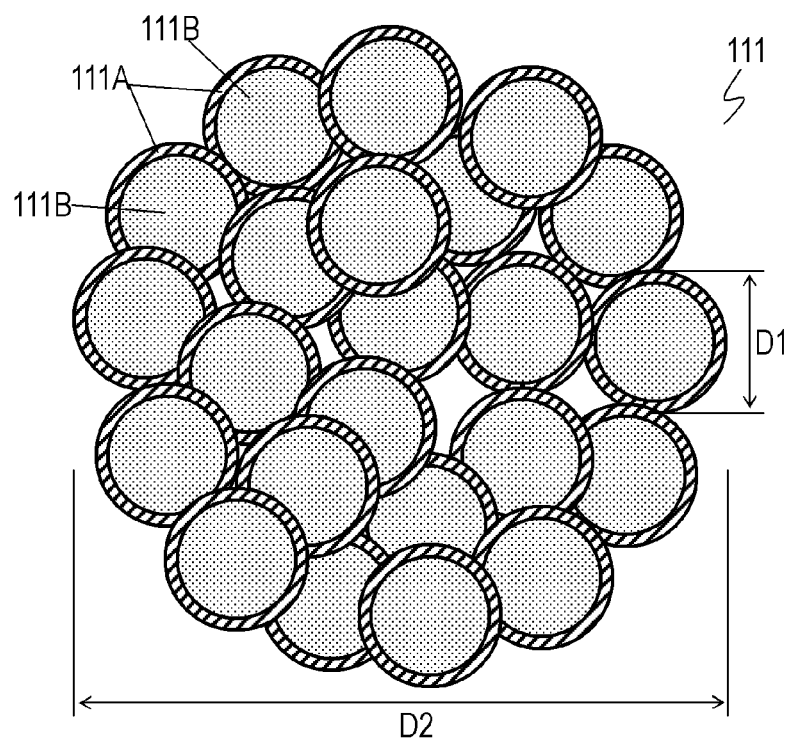
FIG. 5D is a cross-sectional view of a powdery microcapsule of the thermal insulation sheet in accordance with Embodiment 2.

Heat storage sheet 113 contains resin 112 and powdery microcapsules 111 mixed with resin 112. Powdery microcapsules 111 encapsulate therein latent-heat storage agent. FIG. 5D is a cross-sectional view of powdery microcapsule 111. Powdery microcapsule 111 includes plural spherical capsules 111A and latent-heat storage agent 111B encapsulated in each of capsules 111A. Capsules 111A according to Embodiment 2 are made of formalin resin. Latent-heat storage agent 111B according to Embodiment 2 is made of a paraffin with a melting point of about 39° C. Each of capsules 111A has a spherical body having diameter D1 ranging from 1 μm to 3 μm. Powdery microcapsule 111 is a secondary particle having diameter D2 of about 50 μm including plural capsules 111A which agglomerating. In heat storage sheet 113 with a thickness of about 0.6 mm, powdery microcapsules 111 are mixed with resin 112 and the resultant mixture is shaped to have a sheet shape. Resin 112 may be made of, e.g. urethane resin. Urethane resin allows even a large amount of powdery microcapsules 111 to be mixed with the resin with no crush. Resin 112 made of urethane resin provides heat storage sheet 113 with flexibility.

Heat storage sheet 113 contains about 70% by weight of powdery microcapsules 111. A large mixing ratio of powdery microcapsules 111 in heat storage sheet 113 increases a thermoconductivity of heat storage sheet 113. However, a mixing ratio larger than 90% by weight has difficulty not only in kneading but also in retaining strength and a shape as a sheet. In contrast, when the mixing ratio of powdery microcapsules 111 is smaller than 40% by weight, powdery microcapsules 111 as secondary particles are separated from each other and suspended in resin 112. Under the condition, heat storage sheet 113 has poor heat accumulation and fails to offer adequate performance of it. According to Embodiment 2, the mixing ratio is not less than 40%. This ratio allows powdery microcapsules 111 to contact each other, hence allowing heat to transmit quickly to all over heat storage sheet 113. Considering above, the mixing ratio of powdery microcapsules 111 in heat storage sheet 113 preferably ranges from 40% to 90% by weight; more preferably, from 50% to 90%.

A sheet formed by just mixing urethane resin and powdery microcapsules 111 has a surface roughness of about 0.02 μm. According to Embodiment 2, surface roughness Ra of heat storage sheet 113 is about 5 μm. This roughness allows heat storage sheet 113 to have a large surface area. That is, heat storage sheet 113 radiates a large amount of heat from a surface thereof, suppressing the rising of a temperature of thermal insulation sheet 2001. Heat storage sheet 113 with surface roughness Ra not more than 2 μm decreases heat radiated from the surface. Heat storage sheet 113 with surface roughness Ra not less than 20 μm can hardly retain the shape as a sheet. Considering above, heat storage sheet 113 preferably have surface roughness Ra not less than 2 μm and not more than 20 μm. This range of the surface roughness provides heat storage sheet 113 with heat radiation ratio not smaller than 80% on a surface thereof at 60° C. Just after storing heat generated in a heat-generating component thermally connected to thermal insulation sheet 2001, heat storage sheet 113 radiates the heat. Therefore, even when a heat-generating component keeps working, a rising of a temperature of the heat-generating component is suppressed.

Surface 114A of insulation sheet 114 is affixed to surface 113B of heat storage sheet 113. Insulation sheet 114 according to Embodiment 2 is made of polyethylene terephthalate (PET) with a thickness of about 10 μm. Surface 116A of highly-thermoconductive sheet 116 is affixed on surface 114B of insulation sheet 114 with an adhesive of acrylic resin. Highly-thermoconductive sheet 116 is made of, e.g. a pyrolytic graphite sheet with a thickness of about 25 μm. Other than the pyrolytic graphite sheet, highly-thermoconductive sheet 116 may be made of material, such as copper film and aluminum film, having thermoconductivity not less than of 100 W/m° K. A graphite sheet has a higher thermoconductivity, about 1600 W/m° K, in the surface direction parallel to surfaces 116A and 116B than the aforementioned metallic films, and has high flexibility. From the reason above, a graphite sheet is preferably employed for highly-thermoconductive sheet 116.

"Affixing" heat storage sheet 113 to insulation sheet 114 means that heat storage sheet 113 is "affixed" to insulation sheet 114 as a result of manufacturing steps. That is, after heat storage sheet 113 is formed, insulation sheet 114 may be affixed to storage sheet 113, or heat storage sheet 113 may be formed on surface 114A of insulation sheet 114.

Figure 6:
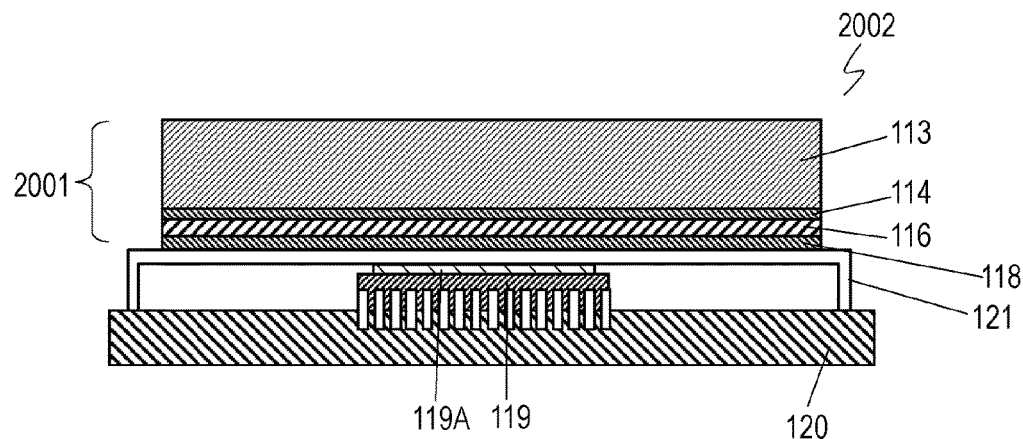
FIG. 6 is a cross-sectional view of an electronic device in accordance with Embodiment 2.

FIG. 6 is a cross-sectional view of device 2002 including thermal insulation sheet 2001. Device 2002 includes substrate 120, heat-generating component 119, such as an integrated circuit (IC) mounted on substrate 120, shield case 121 thermally connected to heat-generating component 119 with thermal interface material 119A, and thermal insulation sheet 2001. Surface 116B of highly-thermoconductive sheet 116 of thermal insulation sheet 2001 is affixed on shield case 121 with insulation sheet 118 of a double-sided adhesive tape. This structure above allows heat generated in heat-generating component 119 to transmit to highly-thermoconductive sheet 116 via shield case 121 and is diffused in the surface direction of highly-thermoconductive sheet 116. The entire of highly-thermoconductive sheet 116 is completely affixed to heat storage sheet 113, thereby allowing heat to smoothly transmit to the entire area of heat storage sheet 113. When latent-heat storage agent 111B reaches a predetermined temperature, the heat transmitting to heat storage sheet 113 is used for melting latent-heat storage agent 111B. Then, latent-heat storage agent 111B retards heat storage sheet 113 from temperature rise. The structure addresses particularly sudden heat generation of heat-generating component 119. The surface roughness of heat storage sheet 113 being a predetermined value provides heat storage sheet 113 with a large surface area. Infrared radiation of heat storage sheet 113 with the large surface area effectively diffuses heat, reducing the temperature of heat-generating component 119.

Figure 7:
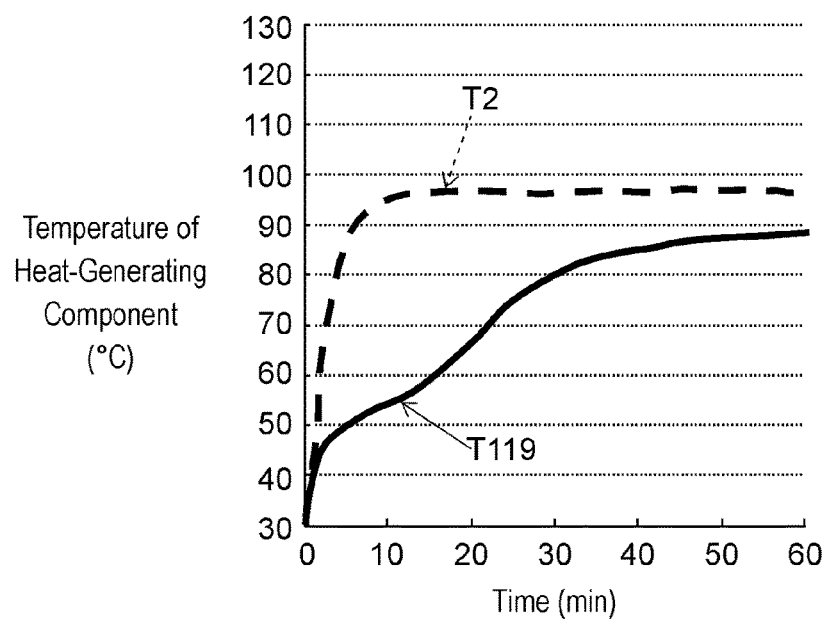
FIG. 7 shows an evaluation result of the thermal insulation sheet in accordance with Embodiment 2.

FIG. 7 shows temperature T119 of heat-generating component 119 mounted to device 2002 including thermal insulation sheet 2001 according to Embodiment 2. FIG. 7 also shows temperature T2 of heat-generating component 2 mounted to conventional electronic device 500 shown in FIG. 9. Device 2002 according to Embodiment 2 have a smaller gradient of temperature rise smaller in an early stage of heat generation, and a lower reaching temperature of the heat-generating component in prolonged heat generation than conventional electronic device 500.

According to Embodiment 2, latent-heat storage agent 111B encapsulated in capsules 111A has the same melting point of about 39° C. Heat storage sheet 113 does not necessarily have a single type of powdery microcapsules 111. Resin 112 may be mixed with powdery microcapsules 111 with, e.g. latent heat storage agent having a melting point of about 39° C. and powdery microcapsules 111 with latent-heat storage agent having a melting point of about 60°

C. Such structured heat storage sheet further suppresses a rapid rising in temperature of heat-generating component 119.

A method for manufacturing thermal insulation sheet 2001 will be described below. FIGS. 8A to 8D illustrate the method for manufacturing thermal insulation sheet 2001.

First, powdery microcapsules 111 is mixed with resin 112 to provide heat-storage paste 117.

Resin 112 according to the embodiment is made of urethane resin. The urethane resin contains base compound and a curative agent. The urethane resin which is hardened has a penetration depth ranges from of 50 to 250 by resin hardening evaluation of JIS K2207, more preferably, from 80 to 180. Ordinary urethane resin has a penetration depth not more than 20. If a large amount of the powdery microcapsules is mixed with such an ordinary urethane resin and the mixture is hardened, the hardened mixture is brittle and therefore fails to retain a sheet form. In contrast, a urethane resin with an excessively large penetration depth impairs the strength thereof, and therefore fails to retain a sheet form. According to Embodiment 2, however, a urethane resin with a penetration depth ranging from 50 to 250; more preferably, from 80 to 180 is employed. The urethane resin above allows the mixture to retain a sheet form even if powdery microcapsules 111 is mixed into the resin at a mixing ratio not smaller than 40% by weight. Resin 112 has a cross-linking speed of about 600 minutes. In the forming process, the base compound and the curative agent are mixed with each other and the mixture is left at room temperature. The cross-linking speed represents the time for which the viscosity of the mixture becomes three times higher than the viscosity measured immediately after being mixed.

According to Embodiment 2, heat-storage paste 117 contains, by about 70% by weight of powdery microcapsule 111 and about 30% by weight of resin 112.

Figure 8A:
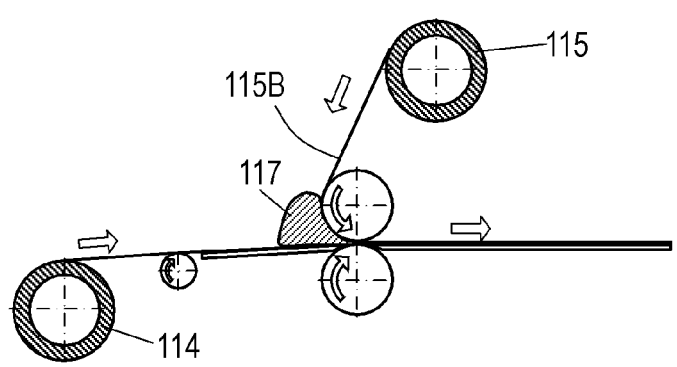
FIG. 8A illustrates a method for manufacturing the thermal insulation sheet in accordance with Embodiment 2.
Figure 8B:
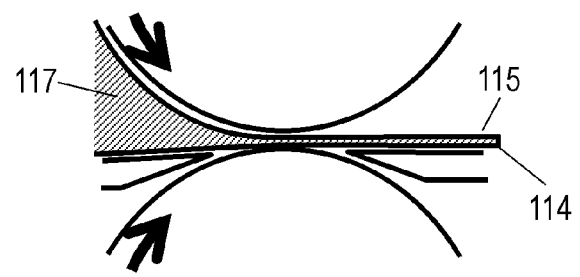
FIG. 8B illustrates the method for manufacturing the thermal insulation sheet in accordance with Embodiment 2.

As shown in FIGS. 8A and 8B, heat-storage paste 117 is processed by a roll former while being sandwiched between surface 114a of insulation sheet 114 and surface 115b of shaper sheet 115, and has a sheet with a thickness of about 0.6 mm. This process allows heat storage sheet 113 of heat-storage paste 117 to contact surface 114a of insulation sheet 114 and surface 115b of shaper sheet 115.

Insulation sheet 114 is a PET film with a thickness of about 5 µm. A corona treatment is performed to surface 113A of heat storage sheet 113 to form polar groups, such as hydroxyl groups or carboxyl groups, on surface 113A. This treatment polarizes surface 113A, and further, provides irregularities in the surface. This structure allows surface 114A of insulation sheet 114 to have high wettability to resin 112, and allows resin 112 to spread along surface 114A of insulation sheet 114 when heat storage sheet 113 is formed. That is, layer 113D (see FIG. 5B) with no powdery microcapsule 111 is formed at surface 113B of heat storage sheet 113 contacting insulation sheet 114. Layer 113D has a thickness ranging from about 5 to 10 µm. Upon being hardened, resin 112 allows heat storage sheet 113 to be attached firmly to insulation sheet 114, and increases thermoconductivity between sheets 113 and 114.

Shaper sheet 115 is a PET film with a thickness of about 10 µm. Surface 115B of shaper sheet 115 contacting heat-storage paste 117 has a contact angle of about 70° to water.

Figure 8C:
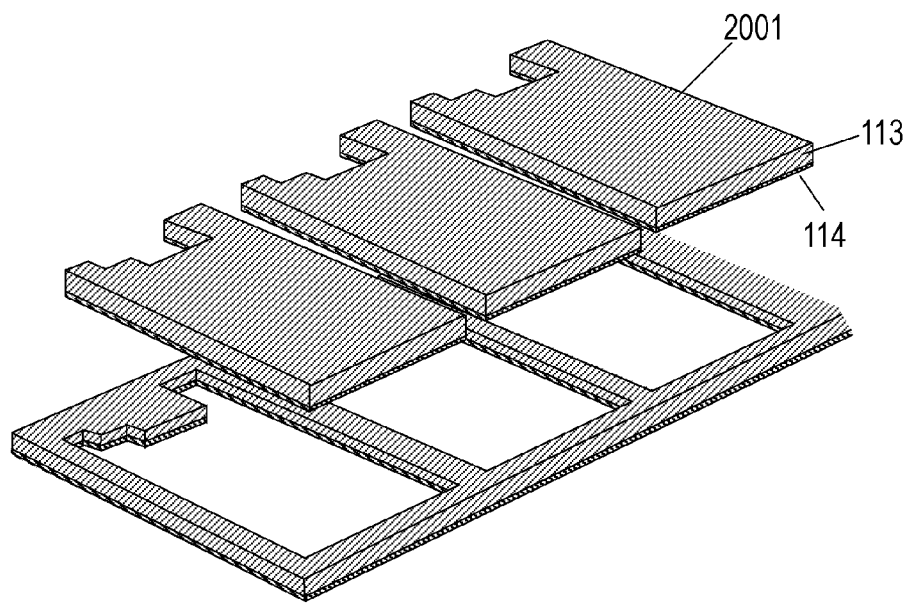
FIG. 8C illustrates the method for manufacturing the thermal insulation sheet in accordance with Embodiment 2.

Next, the layered structure of insulation sheet 114, heat-storage paste 117, and shaper sheet 115 is put into a drier and dried at 90° C. for about 12 hours while shaper sheet 115 faces up. In the process, heat-storage paste 117 is heated and hardened to provide heat storage sheet 113. After that, shaper sheet 115 is removed from surface 113A of heat storage sheet 113. Next, as shown in FIG. 8C, the layered structure of insulation sheet 114 and heat storage sheet 113 is cut into a predetermined shape with a mold tool. At this moment, shaper sheet 115 may be removed after the layered structure of insulation sheet 114 and heat storage sheet 113 is cut into a predetermined shape.

A slight amount of paraffin may be left on the surface of powdery microcapsule 111. Besides, if some of powdery microcapsules 111A may be broken in the process of mixing powdery microcapsules 111 with resin 112, paraffin can come out from the inside. In this way, a slight amount of paraffin can be left in resin 112 of heat-storage paste 117. If such heat-storage paste 117 is hardened in a dryer at about 90° C. to form heat storage sheet 113, paraffin melted at high temperatures is easily deposited on the surface of heat storage sheet 113. Paraffin has a density of about 0.9 g/cm$^3$ and resin 112 according to Embodiment 2 has a density of about 0.934 g/cm$^3$, so that paraffin may be deposited on the upper part of the surfaces of heat storage sheet 113.

According to Embodiment 2, surface 115B of shaper sheet 115 contacting heat-storage paste 117 has a contact angle to water of about 70° C. Therefore, surface 115B of shaper sheet 115 has high wettability to the paraffin deposited on the surface of heat-storage paste 117 (i.e., heat storage sheet 113), thereby removing the paraffin deposited on surface 113A together with shaper sheet 115 when shaper sheet 115 is removed from heat storage sheet 113. The removal process provides surface 113A of heat storage sheet 113 with irregularities therein, forming heat storage sheet 113 with surface roughness Ra of not less than 2 µm and not more than 20 µm. If heat storage sheet 113 has residual paraffin therein, the paraffin can spatter around in highly-heated device 2002, getting the inside of device 2002 dirty. According to Embodiment 2, however, residual paraffin in heat storage sheet 113 is reduced, eliminating an adverse effect on device 2002. Further, a large surface roughness of surface 113B of heat storage sheet 113 enhances heat dissipation, suppressing temperature rise of heat-generating component 119 even when heat-generating component 119 keeps working.

Surface 115B of shaper sheet 115 contacting heat-storage paste 117 preferably have a contact angle to water not less than 60° and not more than 75°. A contact angle greater than 75° increases detachability of surface 115B from paraffin, reducing the effect on the removing of paraffin from surface 113A. Conversely, a contact angle smaller than 60° allows paraffin to excessively tightly contact surface 113A. This can damage heat storage sheet 113 when shaper sheet 115 is removed. The contact angle to water of surface 114A of insulation sheet 114 contacting heat-storage paste 117 is preferably smaller than that of surface 115B of shaper sheet 115. This arrangement allows shaper sheet 115 to be smoothly removed from heat storage sheet 113.

The thickness of shaper sheet 115 is preferably not less than 5 µm and not more than 30 µm. A thickness smaller than 5 µm easily causes breakage of shaper sheet 115 when shaper sheet 115 is removed. In contrast, a thickness larger than 30 µm prevents shaper sheet 115 from being removed.

The cross-linking speed of resin 112 is preferably not less than 200 minutes and not more than 1500 minutes. A cross-linking speed less than 200 minutes prevents paraffin from being deposited on the surface of heat-storage paste 117 in the hardening process. Conversely, a cross-linking speed larger than 1500 minutes degrades the productivity of thermal insulation sheet 2001.

Figure 8D:
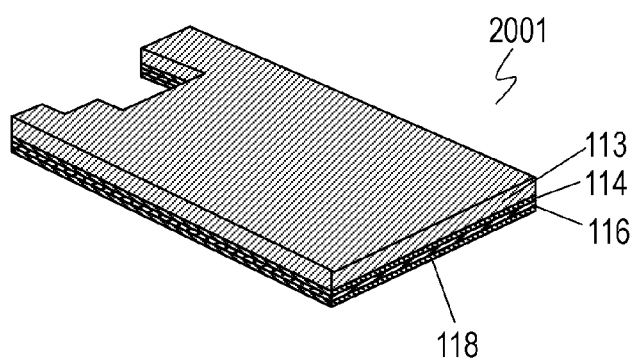
FIG. 8D illustrates the method for manufacturing the thermal insulation sheet in accordance with Embodiment 2.

Next, highly-thermoconductive sheet 116 is affixed on surface 114B of insulation sheet 114, thus providing thermal insulation sheet 2001 shown in FIG. 8D. Highly-thermoconductive sheet 116 is a pyrolitic graphite sheet with a thickness of about 25 µm. Highly-thermoconductive sheet 116 is affixed to surface 114B of insulation sheet 114 with double-sided adhesive tape disposed on surface 116A of highly-thermoconductive sheet 116.

Insulation sheet 118 is preferably affixed to surface 116B of highly-thermoconductive sheet 116. In this case, highly-thermoconductive sheet 116 having insulation sheet 118 previously affixed to surface 116B of highly-thermoconductive sheet 116 is affixed to surface 114B of insulation sheet 114. This process protects highly-thermoconductive sheet 116 during handling. Insulation sheet 118 may be a double-sided adhesive tape. This material allows heat-generating component 119 to tightly contact highly-thermoconductive sheet 116, enhancing the performance of highly-thermoconductive sheet 116.

INDUSTRIAL APPLICABILITY

A thermal insulation sheet according to the present invention suppresses or retards the transmitting of heat generated in a heat-generating component to outside, and suppresses a rapid rising of a temperature of the heat-generating component. It is therefore useful as a heatsink for heat-generating components.

REFERENCE MARKS IN THE DRAWINGS 11 powdery microcapsule
11B latent-heat storage agent
12 resin
13 heat storage sheet
14 insulation sheet
15 highly-thermoconductive sheet
17 heat-storage paste
111B latent-heat storage agent
111 powdery microcapsule
112 resin
113 heat storage sheet
115 shaper sheet
114 insulation sheet
116 highly-thermoconductive sheet
117 heat-storage paste
1001 thermal insulation sheet
2001 thermal insulation sheet

The invention claimed is:

1. A method for manufacturing a thermal insulation sheet, comprising:
providing powdery microcapsules having a moisture content not less than 0.4% and not more than 2%, the powdery microcapsules encapsulating latent-heat storage agent;
providing a heat-storage paste containing a resin and the powdery microcapsules mixed with the resin;
forming a heat storage sheet made of the heat-storage paste by providing the heat-storage paste on a first surface of an insulation sheet;
hardening the heat storage sheet by heating the heat storage sheet; and
affixing a highly-thermoconductive sheet to a second surface of the insulation sheet opposite to the first surface of the insulation sheet,
wherein, the heat storage sheet has a void ratio not less than 10% and not more than 30%.

2. The method according to claim 1,
wherein said providing the powdery microcapsules having the moisture content not less than 0.4% and not more than 2% comprises controlling the moisture content of the powdery microcapsules to cause the powdery microcapsules to have the moisture content not less than 0.4% and not more than 2%, and
wherein said controlling the moisture is executed before said providing of the heat-storage paste.

3. The method according to claim 1, further comprising cutting the heat storage sheet and the insulation sheet into predetermined shapes.

4. A method for manufacturing a thermal insulation sheet, comprising:
providing powdery microcapsules having a moisture content not less than 0.4% and not more than 2%, the powdery microcapsules encapsulating latent-heat storage agent;
providing a heat-storage paste containing a resin and the powdery microcapsules mixed with the paste;
forming a heat storage sheet made the heat-storage paste on a first surface of an insulation sheet;
hardening the heat storage sheet by heating the heat storage sheet; and
affixing a highly-thermoconductive sheet to a second surface of the insulation sheet opposite to the first surface of the insulation sheet,
wherein the heat storage sheet has a first surface and a second surface opposite to the first surface of the heat storage sheet, the first surface of the heat storage sheet being affixed to the first surface of the insulation sheet,
wherein, the heat storage sheet has a void ratio not less than 10% and not more than 30%, and
wherein a surface roughness Ra of the second surface of the heat storage sheet is not less than 2 µm and not more than 20 µm.

5. The method according to claim 4,
wherein said forming of the heat storage sheet comprises sandwiching heat-storage paste between the first surface of the insulation sheet and a surface of a shaper sheet, such that the surface of shaper sheet makes contacts the second surface of the heat storage sheet,
said method further comprising removing the shaper sheet from the second surface of the heat storage sheet after said forming of the heat storage sheet.

6. The method according to claim 5, wherein said removing of the shaper sheet from the second surface of the heat storage sheet comprises causing a surface roughness Ra of the second surface of the heat storage sheet to be not less than 2 µm and not more than 20 µm by removing the shaper sheet from the second surface of the heat storage sheet.

7. The method according to claim 5, wherein said removing of the shaper sheet is executed after said hardening of the heat storage sheet by heating the heat storage sheet.

8. The method according to claim 5, wherein the shaper sheet has a contact angle to water not less than 60° and not more than 75°.

9. The method according to claim 5, wherein the shaper sheet has a thickness not less than 5 µm and not more than 30 µm.

10. The method according to claim 2, wherein said controlling the moisture content of the powdery microcapsules comprises controlling the moisture content of the powdery microcapsules to cause the powdery microcapsules to have the moisture content not less than 0.4% and not more than 2% by putting the powdery microcapsules in a humidifier or a drier.

11. The method according to claim 1, wherein the powdery microcapsules encapsulating the latent-heat storage agent comprises first powdery microcapsules and second powdery microcapsules, the first latent-heat storage agent having a first melting point, the second latent-heat storage agent having a second melting point different from the first melting point.

12. The method according to claim 4,
wherein said providing the powdery microcapsules having the moisture content not less than 0.4% and not more than 2% comprises controlling the moisture content of the powdery microcapsules to cause the powdery microcapsules to have the moisture content not less than 0.4% and not more than 2%, and
wherein said controlling the moisture content of the powdery microcapsules is executed before said providing of the heat-storage paste.

13. The method according to claim 12, wherein said controlling the moisture content of the powdery microcapsules comprises controlling the moisture content of the powdery microcapsules to cause the powdery microcapsules to have the moisture content not less than 0.4% and not more than 2% by putting the powdery microcapsules in a humidifier or a drier.

14. The method according to claim 4, wherein the powdery microcapsules encapsulating the latent-heat storage agent comprises first powdery microcapsules and second powdery microcapsules, the first latent-heat storage agent having a first melting point, the second latent-heat storage agent having a second melting point different from the first melting point.

* * * * *